United States Patent
Skerritt et al.

(10) Patent No.: US 6,791,315 B2
(45) Date of Patent: Sep. 14, 2004

(54) CURRENT DETECTOR AND CURRENT MEASURING APPARATUS INCLUDING SUCH DETECTOR WITH TEMPERATURE COMPENSATION

(75) Inventors: Robert Charles Skerritt, Conwy (GB); Mark David Crosier, Isle of Anglesey (GB); Martin Anthony Murray, Bangor (GB); Brian Martin Reeder, Isle of Anglesey (GB)

(73) Assignee: Delta Electrical Limited (GB)

( * ) Notice: Subject to any disclaimer, the term of this patent is extended or adjusted under 35 U.S.C. 154(b) by 0 days.

(21) Appl. No.: 10/169,319

(22) PCT Filed: Jan. 8, 2001

(86) PCT No.: PCT/GB01/00060

§ 371 (c)(1),
(2), (4) Date: Jul. 3, 2002

(87) PCT Pub. No.: WO01/50143

PCT Pub. Date: Jul. 12, 2001

(65) Prior Publication Data

US 2003/0011355 A1 Jan. 16, 2003

(30) Foreign Application Priority Data

Jan. 6, 2000 (GB) .............................................. 0000067

(51) Int. Cl.[7] .............................................. G01R 15/04
(52) U.S. Cl. ....................................... 324/126; 324/130
(58) Field of Search .............................. 324/126, 128, 324/130, 105, 158.1, 613, 691, 713, 115, 765, 149; 333/24 R; 338/49

(56) References Cited

U.S. PATENT DOCUMENTS

| 4,566,053 A | 1/1986 | Strickland, Jr. |
| 4,734,634 A | 3/1988 | Kito et al. |
| 4,743,875 A | * 5/1988 | Murphy ........................ 335/18 |
| 4,866,559 A | 9/1989 | Cobb, III et al. |
| 4,897,756 A | 1/1990 | Zylstra |
| 4,939,451 A | 7/1990 | Baran et al. |
| 5,181,026 A | 1/1993 | Granville |
| 5,223,789 A | 6/1993 | Katsuyama et al. |
| 5,287,107 A | 2/1994 | Gampell et al. |
| 5,430,636 A | 7/1995 | Kachi |
| 5,475,557 A | 12/1995 | Larom et al. |
| 5,485,393 A | * 1/1996 | Bradford ...................... 702/60 |
| 5,490,030 A | 2/1996 | Taylor et al. |
| 5,534,788 A | 7/1996 | Smith et al. |
| 5,563,506 A | * 10/1996 | Fielden et al. ............... 324/142 |
| 5,568,343 A | 10/1996 | Kosugi |
| 5,701,253 A | 12/1997 | Mayell et al. |
| 5,809,451 A | 9/1998 | Parsons et al. |
| 5,867,054 A | 2/1999 | Kotowski |
| 5,875,087 A | 2/1999 | Spencer et al. |
| 5,914,674 A | 6/1999 | Coleman et al. |

(List continued on next page.)

FOREIGN PATENT DOCUMENTS

| CA | 2244692 | 2/1999 | ........... G01R/19/32 |
| DE | 3815824 A1 | 1/1989 | |
| EP | 612081 A1 * | 8/1994 | .......... G01G/00/00 |
| GB | 2318002 A | 4/1998 | |
| JP | 04083175 | 3/1992 | ........... G01R/15/02 |
| WO | WO 00/00834 | 1/2000 | |

Primary Examiner—Minh Chau
(74) Attorney, Agent, or Firm—Kirk D. Houser; Eckert Seamans Cherin & Mellott, LLC

(57) ABSTRACT

A current sensing device and a residual current detection device are described having a temperature compensation capability so that residual current can be directly measured to a high degree of precision in the background of a high load current. The residual current device comprises a plurality of resistive shunts for connection in respective ones of a plurality of lines through which current can flow to and from a load, and a detector means sensitive to the voltage developed across each of the shunts to detect any imbalance between the currents flowing through the shunts.

21 Claims, 5 Drawing Sheets

U.S. PATENT DOCUMENTS

| | | | |
|---|---|---|---|
| 5,930,093 A | 7/1999 | Morrissett | |
| 6,005,758 A | 12/1999 | Spencer et al. | |
| 6,028,426 A | 2/2000 | Cameron et al. | 324/126 |
| 6,031,749 A | 2/2000 | Covington et al. | |
| 6,034,521 A | 3/2000 | Eckardt | |
| 6,058,354 A | 5/2000 | Adame et al. | |
| 6,191,989 B1 | 2/2001 | Luk et al. | |
| 6,233,128 B1 | 5/2001 | Spencer et al. | |
| 6,239,589 B1 * | 5/2001 | Windsheimer | 324/142 |
| 6,259,267 B1 | 7/2001 | Fujiwara | |
| 6,313,690 B1 | 11/2001 | Ohshima | |
| 6,335,852 B1 | 1/2002 | Nimmo | |
| 6,356,426 B1 | 3/2002 | Dougherty | |

* cited by examiner

CURRENT DETECTOR AND CURRENT MEASURING APPARATUS INCLUDING SUCH DETECTOR WITH TEMPERATURE COMPENSATION

FIELD OF THE INVENTION

This invention relates to a current sensor with a temperature compensation capability intended for use in an electrical apparatus such as a residual current correction device, a current meter or a power meter.

DISCUSSION OF THE BACKGROUND ART

It is an aim of the present invention to provide a current sensor in economical form which includes temperature sensing means for facilitating temperature compensation.

SUMMARY OF THE INVENTION

In accordance with the invention there is provided a current sensor comprising a metallic link member having two end portions of conductive material and an intermediate portion interconnecting the end portions, said intermediate portion being formed of a resistive material, and an integrated circuit analog to digital converter mounted on said link member, said converter having analog input terminals connected to respective ones of said two end portions and digital output terminals for connection to a processing apparatus, wherein a temperature sensor is provided on or within said intermediate portion.

The temperature sensor is preferably an electronic semiconductor temperature sensor and may be mounted directly onto the intermediate portion with a thermally suitable conducting glue. The temperature sensor may be built into (i.e. integrated) into the integrated circuit analog to digital converter in which case it will form part of a semiconductor die mounted directly onto the intermediate portion.

Embodiments of the invention have the advantage that the temperature sensor will follow the temperature of the intermediate portion very closely. It is therefore possible to compensate for changes in the resistance of the intermediate portion resulting from temperature variations as the current flowing therethrough changes.

Conveniently, the converter is attached to the intermediate portion by a layer of electrically insulative adhesive material and the analog input terminals of the converter are connected to the end portions by wire bonds.

The converter preferably includes a delta-sigma modulator which provides a high frequency one-bit digital data. One or more decimation filtering stages may be included in the converter.

The converter may also have a voltage reference terminal for connection to a reference voltage source, the converter operating to provide digital output signals respectively representing the current flowing through said intermediate portion and digital output signals representing the voltage on one of said end portions.

Embodiments of the invention may be advantageously employed in residual current devices. Conventionally, residual current is detected utilising a current transformer having primary windings through which, in the case of a single phase device, load current flows in opposite directions so that if the return current is different from the outwardly flowing current because of current leakage an output current signal is induced in a secondary winding of the transformer. In the case of a multi-phase device, primary windings of the transformer are connected in all of the phase lines and the neutral line. In normal situations, when there is no current leakage, the net current induced in the secondary winding is zero and therefore no output is detected.

Sophisticated materials have been developed for the core of the current transformer, which enable considerable accuracy to be obtained when the currents flowing in the primary windings are substantially sinusoidal. However, switch mode power supplies are often used for computers and other equipment and there is an increasing tendency for such equipment to cause dc offsets in the currents. Such developments have made detectors utilising current transformers less reliable and prone to false tripping or failure to detect a dc current leakage.

This is a particular problem in the case of directly actuated electro-mechanical devices, where the current transformer secondary winding actually drives an actuator. The situation is not much improved, when including an electronic detection and amplification means connected to the secondary winding, as there are still problems with high frequency transients and dc offsets. A very small dc current level can cause the core to saturate thereby seriously impairing the ability of the detector to detect current leakage.

It is also an aim of the present invention to provide a residual current detection device in which the above mentioned problems are substantially overcome in a simple and efficacious manner.

In accordance with the invention there is further provided a residual current detection device comprising a plurality of resistive shunts for connection in respective ones of a plurality of lines though which current can flow to and from a load, and detector means sensitive tothe voltage developed across each of the shunts to detect any imbalance between the currents flowing though the shunts, wherein a temperature compensation means is provided for facilitating compensation for fluctuations in shunt resistance with variations in temperature.

In preferred embodiments, the temperature compensation means is a temperature sensor provided on or within each of said plurality of resistive shunts.

Preferably, the detector means comprises an analog to digital converter for each shunt and a processor for receiving the digital signals from the converters and determining whether a current imbalance exists. In this case, the temperature sensor may be built into (i.e. integrated) into the analog to digital converter. The temperature sensor is preferably an electronic semiconductor temperature sensor mounted directly onto the shunt with a thermally conducting glue.

Each shunt preferably takes the form of a composite strip having conductive portions at its ends and a resistive portion interconnecting the conductive portions. Such composite strips can be mass produced inexpensively to very high tolerances which makes them extremely suitable for this purpose.

The analog to digital converter for each shunt may include a delta-sigma modulator, which generates a high frequency single digital data stream which is converted by decimation filtering to a multibit digital data stream at a lower frequency.

The analog to digital converter for each shunt is preferably connected to the processor through an isolation barrier so that the converter can float at the voltage level of the shunt which it serves. The decimation filtering may be effected entirely in the converter, entirely in the processor or split between the converter and the processor.

DETAILED DESCRIPTION OF THE PREFERRED EMBODIMENT

Figure 1:
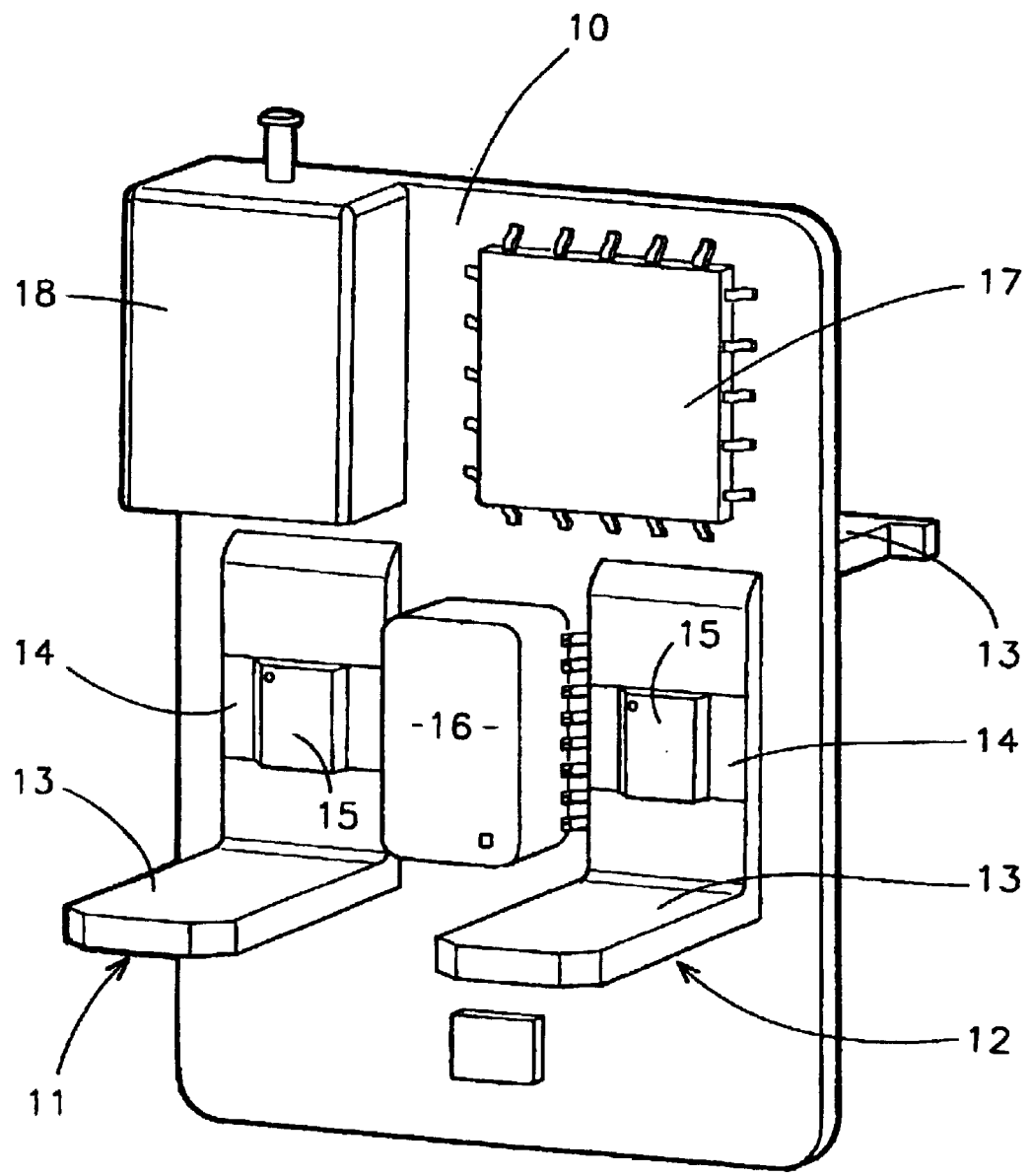
FIG. 1 is a diagrammatic perspective view of an example of the invention as applied to a single phase device.

In the device shown in FIG. 1, a substrate 10 supports two composite conductor strips 11, 12. Each of these includes end portions 13 of copper and an intermediate portion 14 of a resistive material such as manganin. The strips are formed by slicing up a sandwich formed by electron beam welding the copper portions to opposite sides of the manganin portion. The shunts formed by the resistive portions manufactured by this method can have a nominal resistance of 0.2 m$\Omega$ to a tolerance of less than 5%. If the two shunts 14 used on one device are pressed from adjacent portions of the sandwich stock, they are matched to within 2%. Calibration of the shunts built into a unit at two different temperatures can virtually eliminate shunt errors. In this way, at least two temperature measurements are made. Two temperature measurements are taken because the difference in shunt A from shunt B is linear when the devices are adjacent to one another.

However, it is desirable to provide for direct compensation for temperature fluctuations arising from current fluctuations especially in a single current detector. The resistivity of precision resistance materials does not change with temperature. Compared to pure metals such as copper or aluminium, with Temperature Coefficient of Resistance (TCR) values close to 4000 ppm/DegC., the TCR values of Manganin or Zeranin are more than a factor of 400 better— but still not zero.

In reality, the plot of Resistance Vs Temperature (R(T)-curve) is not strictly linear and it is common practice to describe the curves by a third order polynomial. In general this is:

$R(T)=R_o*(1+a_o*T+b_o*T^2+c_o*T^3)$ where T=Temperature in DegC. & $R_o$=Resistance at 0 DegC..

At a more practical Reference Temperature of 20 Deg C.. we can rewrite this as $R(T)=R20*[1+a_o*(T-20)+b_o*(T-20)^2+c_o*T(-20)^3]$ The typical curves for the resistance materials Manganin and Zeranin curves are determined by the main composition of the alloys and vary very little from batch to batch. The production spread is less than 5 to 10 ppm/DegC.. These slight differences in the TCR value can be expressed in a tiny change of the first order coefficient "a" in the above equation and the second and third coefficients are basically not changed. For example a dR(T)/R20-curve for different batches is just rotated around the 20 DegC. point and the curve itself is unchanged. This explains the calibration of the shunts at two different temperatures mentioned above.

However in accordance with the present invention, it may be desired to calibrate each individual shunt in an RCD OR in the case of the Current Sensor (Single Shunt) we could calibrate it separately. Varying as a third order polynomial at least 4 if not more points for a good calibration would be needed.

As described by the above equations if we know the temperature and our Ref resistance R20 for example we can with a suitable number of points find the coefficients and calibrate the shunt.

In the preferred embodiment, the temperature sensor itself is built into (integrated) and is a part of the ASIC which includes the analogue to digital converter ADC. In other words the temperature sensor will be an electronic semiconductor temperature sensor in the ADC. The ADC is mounted as a semiconductor die directly onto the shunts with a suitable thermally conducting glue and will therefore track the temperature of the Manganin (shunt) very accurately.

Figure 9:
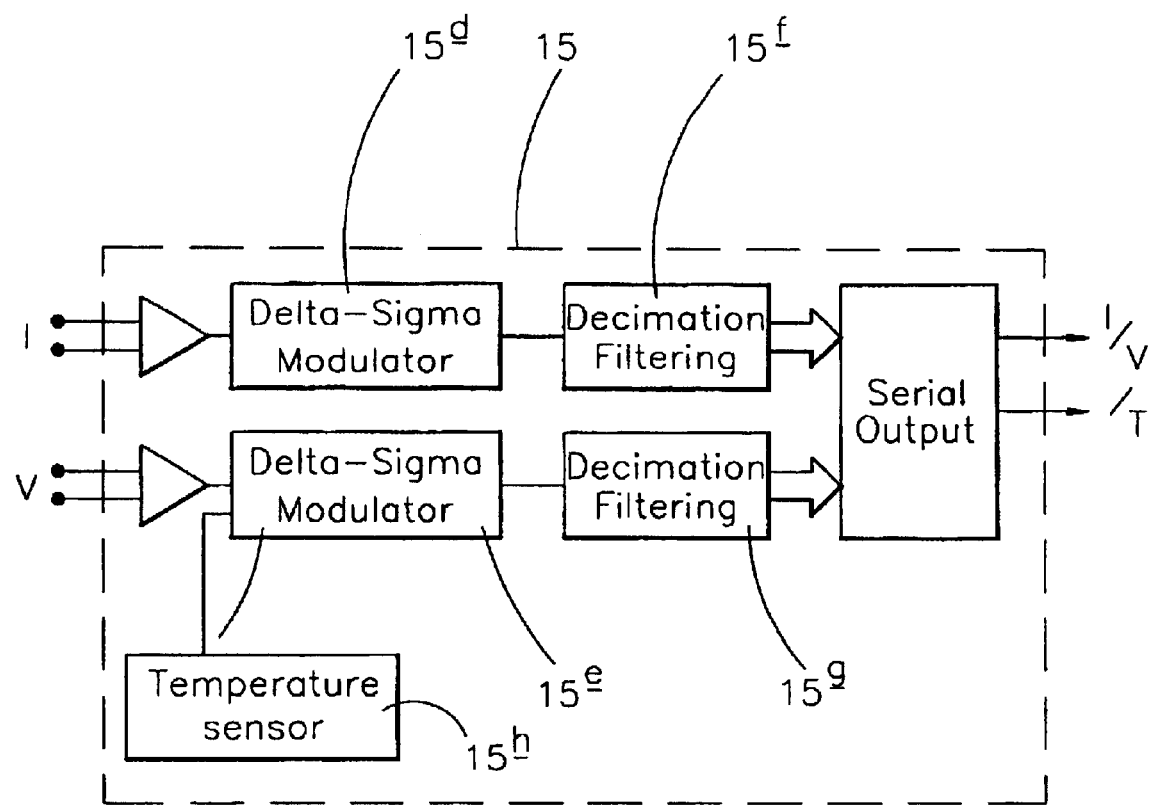
FIG. 9 is a block diagram of a form of the electronic circuit which incorporates a temperature sensor in accordance with and embodiment of the present invention.

Preferably, the temperature sensor is input and sampled via the voltage modulator. It could have its own modulator (see RCD FIG. 9 showing the added temperature channel) or be multiplexed into the voltage channel (see FIG. 2).

Is possible to avoid having to make several stable temperatures to make the measurements. Instead we propose to measure at 20 Deg C. for example and then apply a known current which heats up the shunts and make several measurements during this process until the shunt arrives at its new steady state temperature as a result of the applied current.

In the example shown in FIG. 1, there is a separate signal preprocessing ASIC 15 mounted on each of the shunts 14 and connected to the copper end portions 13 of the associated conductor strips. The two ASICs 15 are connected to via an isolation transformer array 16 to a main processor 17. The ASICs 15 operate to convert the two voltages across the shunts into a digital signal stream which is communicated to the processor 17 via the isolation transformer array. The main processor is programmed to provide a drive signal to a trip actuator 18.

Figure 3:
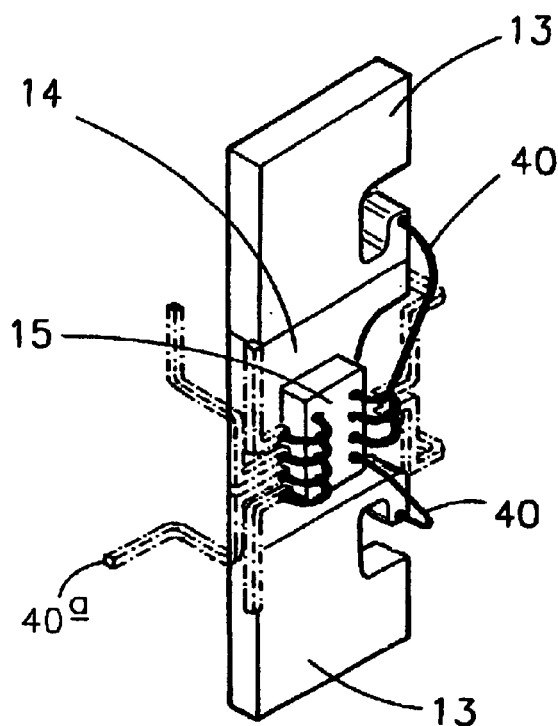
FIG. 3 is a perspective view showing one of the current sensing devices embodying the present invention.
Figure 4:
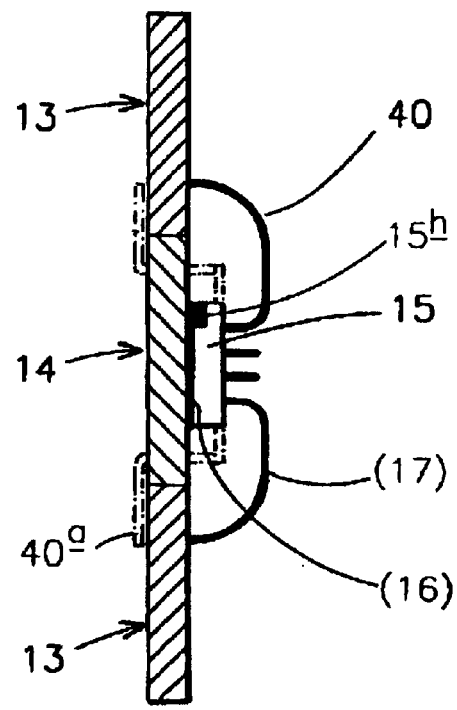
FIG. 4 is a sectional view of the current sensing device of FIG. 3.
Figure 5:
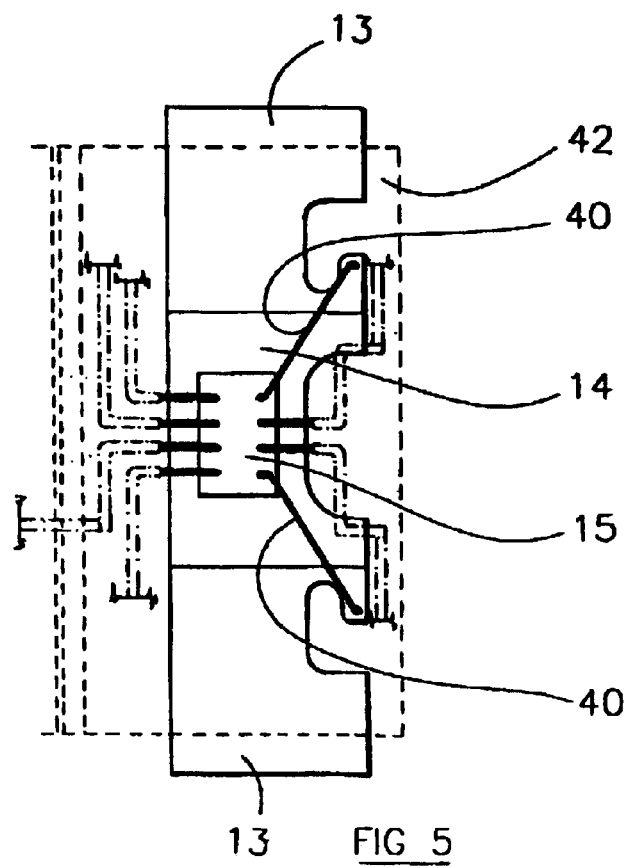
FIG. 5 is an elevation of the device of FIG. 3.

The actual preferred structural configuration of the current sensors is shown in FIGS. 3 to 5. These show leads 40 connecting two analog input terminals of the ASIC to the two copper end portions 13. Other leads connect other terminals of the ASIC 15 to a lead frame 40a by means of which all other external connections are made. FIG. 5 shows in dotted lines a block 42 of encapsulation material and FIG. 4 shows an electrically insulative adhesive layer 41 by means of which the ASIC is attached to the intermediate portion 14, which may be of manganin or zeranin of the composite strip 14, 15. The strips are formed by slicing up a sandwich formed by electron beam welding of the copper bars to opposite sides of a manganin bar. The temperature sensor is preferably integrated within the ADC of the ASIC 15.

Figure 6:
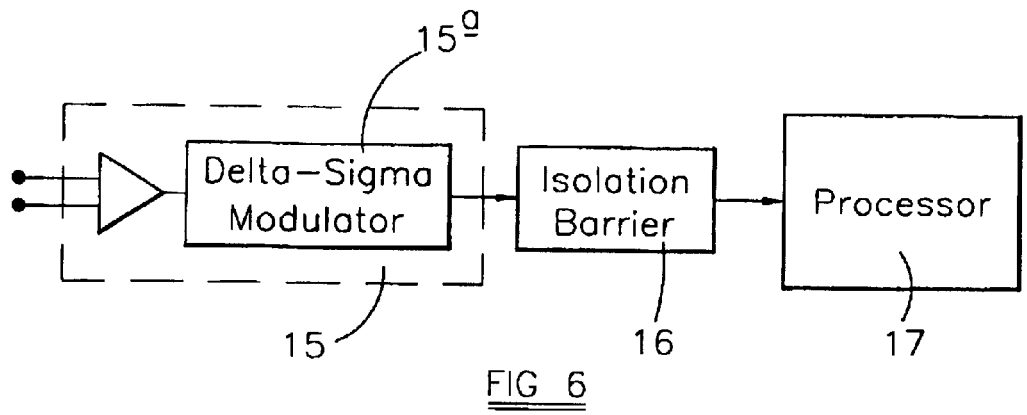
FIG. 6 is a block diagram of a simple form of the electronic circuit of a single current sensor device.

FIG. 6 shows that within the ASIC 15 there is provided a single delta-sigma modulator 15a. There is also an analog input circuit which has its input terminals connected to the copper end portions 13. The output of the ASIC 15 in this case consists of a high frequency one-bit data signal train. In use, the ASIC output is connected via a transformer or other isolation barrier 16 to a processor 17. The processor in this arrangement is configured to carry out one or more decimation filtering operations to convert the one-bit signal stream into a multi-bit value at a lower frequency.

The processor 17 may typically be configured to receive signals from a plurality of the detectors and to sum these signals to ascertain whether the current flows through the detectors are balanced. Such an arrangement can be used for residual current correction allowing an actuator to trip a switch if an unbalanced condition is found to exist. The processor 17 may alternatively or additionally compare the instantaneous current level with a trip level so that overcurrent tripping can be controlled.

Figure 2:
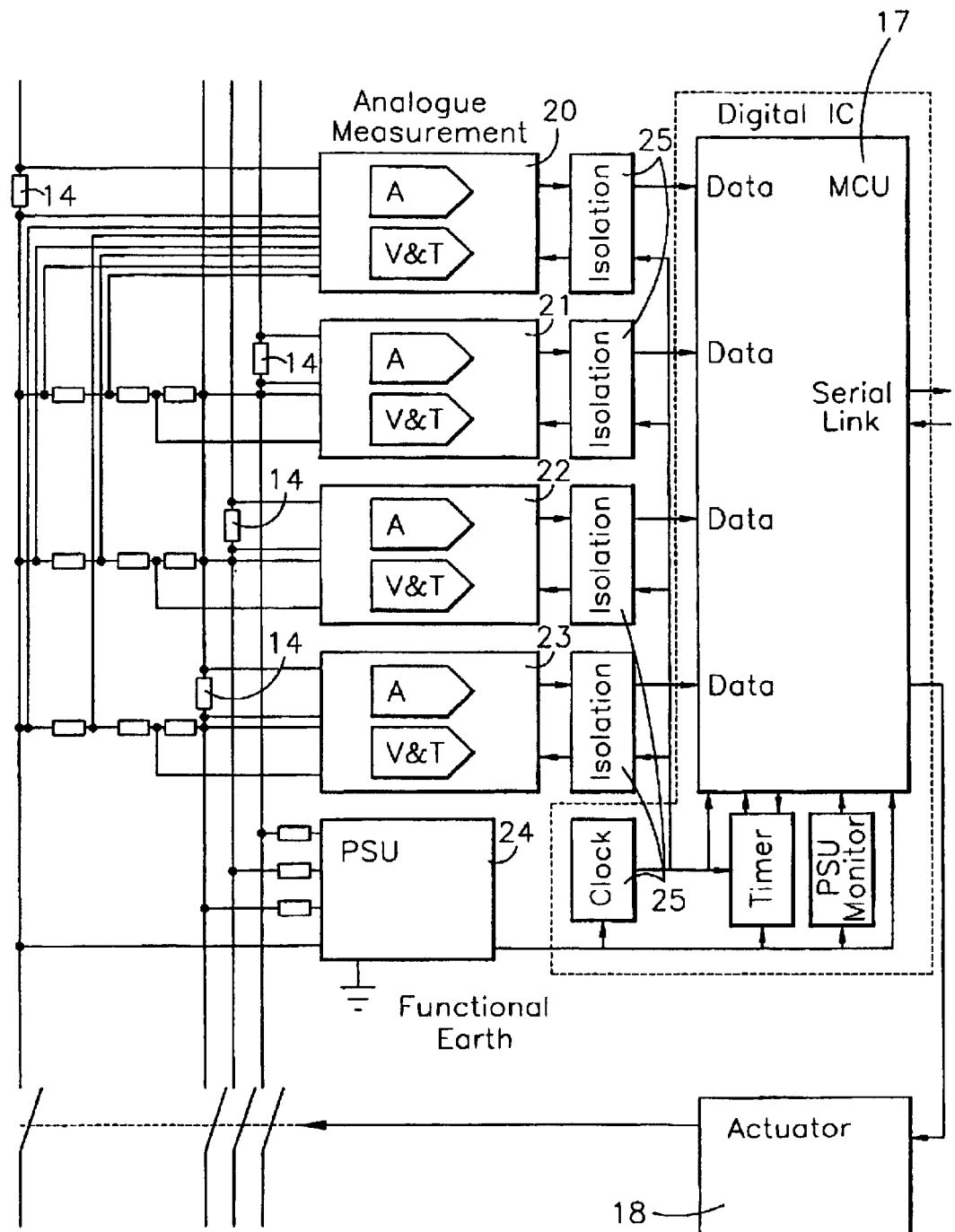
FIG. 2 is a block diagram of an another example of the invention as applied to a three phase device.

FIG. 2 shows in rather more electrical detail a three phase device. In this case there are four shunts 14, one in each phase line and a fourth in the neutral line. The ASICs 15 of FIG. 1 are shown as four separate blocks 20, 21, 22, and 23, and there is a power supply unit 24 which draws power from the phase lines on the mains side of the shunts 14 and provides controlled voltages to the processor 17. Power is supplied to the four blocks 20 to 23 via isolation barriers 25 which make up the array 16. Each block of the ASIC includes an analog to digital converter in the form of a delta-sigma modulator which provides a high frequency one bit digital data stream. A multiplexer may be included in each converter so that the converter can provide to the processor, through the respective isolation barrier, signals representing both current in the associated shunt and the voltage at one end of it. The processor uses these signals to monitor the current in each shunt and to operate the actuator 18 if an imbalance occurs.

It will be noted that the voltage sensing connections to the ASICs are made via resistor chains connected between each phase line and the neutral. Each such resistor chain comprises an outer pair of precision resistors of relatively low ohmic value and an intermediate resistor of relatively high ohmic value. These resistor chains allow the RCD to be provided with an independent reference. If the neutral ADC is taken as the selected system reference, then the operating software of the main processor can use the multiple signals derived from the several resistor chains to calibrate each phase against the neutral reference.

The CPU is programmed to carry out the necessary calculations to determine the existence of an imbalance and can determine the true RMS value of the residual current, which conventional devices fail to do correctly particularly in the case of non-sinusoidal current waveforms. The CPU may be programmed to enable it to determine from the data it receives whether a particular event is, in fact, an unacceptable leakage more reliably than conventional devices. For example, the CPU can take into account the historic performance of the unit when setting the leakage current threshold and may ignore events which have a recognisable "signature". In this way improved tolerance to nuisance tripping can be obtained Decimation filtering of the high frequency one bit data stream is required to reduce each data stream to a multi-bit digital signal at a predetermined sample frequency. By way of example, each current signal may be a 23-bit signal at a sample rate of 64 times the mains frequency, but lower resolution at lower sample rates can be employed when non-linear, rather than linear conversion is acceptable. The decimation filtering is typically a function of the processor, filtering of the four data streams being executed simultaneously so that sample values are derived for all four shunts simultaneously. A circuit employing such an arrangement is shown in FIG. 6 as described above.

Figure 7:
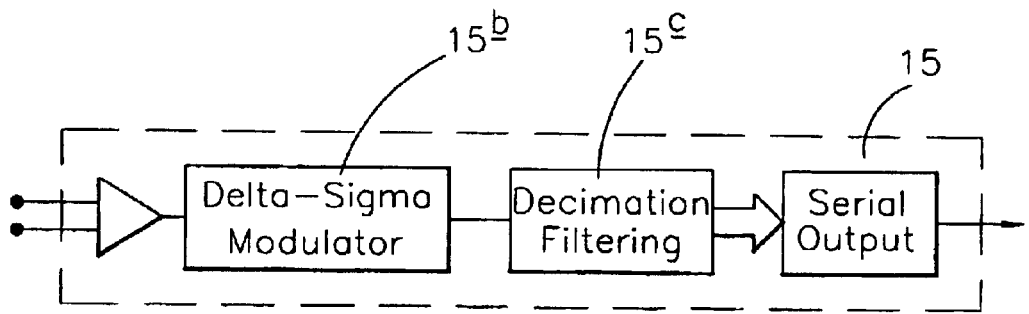
FIG. 7 is a block diagram of an alternative form of the electronic circuit.
Figure 8:
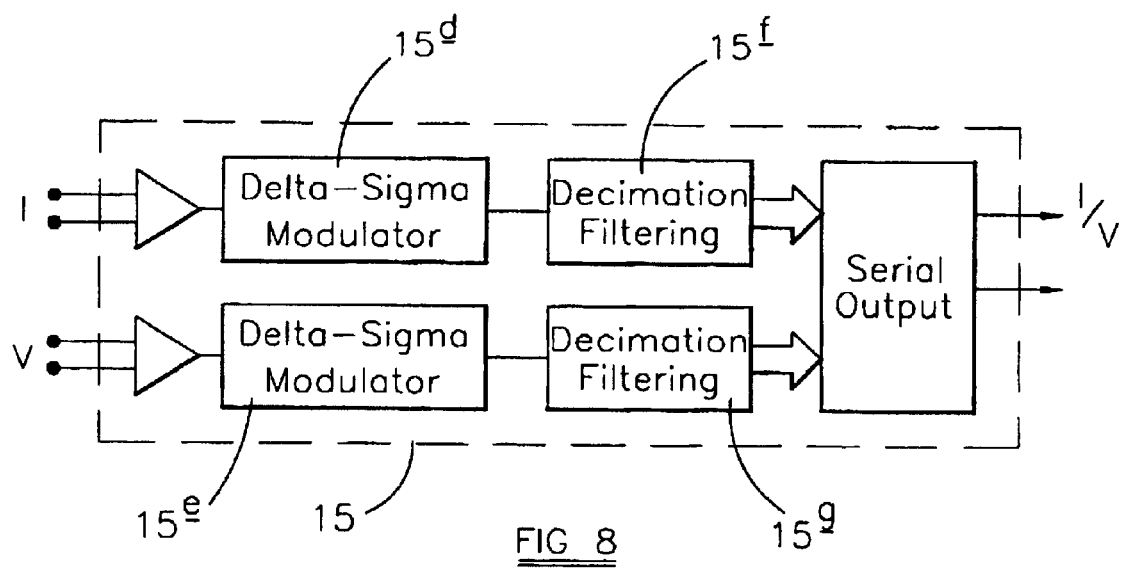
FIG. 8 is a block diagram of yet another form of the electronic circuit.

In an alternative embodiment as shown in FIG. 7, one or more stages of the decimation filtration may be executed by hardware included within the ASIC. This includes a serial output driver 15b to transmit the bits of the multi-bit digital signal produced by the filtration stage 15c serially to the processor. Multi-bit digital words are transmitted serially across the isolation barriers instead of a one-bit signal stream. The filtration stages may be split between the ASIC and the processor. With this arrangement, the configuration of the processor can be simplified as part or all of the decimation filtration operation is carried out in the ASIC.

Where current and voltage are both to be monitored as in the system shown in FIG. 2, the circuit 15 may be as shown in FIG. 8 with separate modulations and filtering components for the two signal streams and a common serial interface. Alternatively separate serial interfaces may be employed. The ASIC of FIG. 8 has a further analog input which can be connected to a reference voltage source. Two analog input stages 21a and 21b are present and these feed signals to two independent delta-sigma modulators 15d, 15e. As shown, there are two independent decimation filtration stages 15f, 15g for the two one-bit digital signal streams. The outputs of the stages 15f, 15g may, as shown, be connected to a common serial output stage or (not shown) separate serial output stages may be provided.

It will be appreciated that the arrangement of FIG. 8 may be modified by the omission of the two filtration stages 15f, 15g where all filtration is to be carried out by the processor.

Where voltage as well as current is monitored by the processor, precise calibration of the shunts can be achieved. This allows more accurate determination of the current balance in RCD applications. Moreover, as voltage and current are both being monitored to a high level of precision, accurate power consumption metering can be obtained.

Where the devices of the invention are used in RCD and overcurrent trip systems, the processor can be programmed to recognise the transients which may occur when loads are switched in and out of circuit to avoid false tripping. Many other convenient functions can be programmed into the processor, made possible by the high precision of the current measurements capable of being carried out.

FIG. 9 shows an arrangement similar to the one of FIG. 8 except for the addition of a temperature sensor in accordance with embodiments of the present invention. The temperature sensor is input and sampled via the voltage modulator. The sensor could have its own modulator (FIG. 9) or be multiplexed into the voltage channel as mentioned above.

The arrangements described enable very accurate detection of current imbalance to be effected even in the presence of switching transients and DC offsets. The problems which arise from potential saturation of the current transformer core are avoided completely.

Since the CPU receives actual line current and voltage data from each of the blocks 20 to 23, it can be programmed to perform other calculations, such as current limit and power consumption. Thus an RCD device constructed as described above can also provide the functions of a conventional circuit breaker and/or those of a power consumption meter without any additional sensing or analog-to-digital components being required.

What is claimed is:

1. A residual current detection device comprising a plurality of resistive shunts for connection in respective ones of a plurality of lines through which current can flow to and from a load, and detector means sensitive to the voltage developed across each of the shunts to detect any imbalance between the currents flowing through the shunts, the detector means comprising a converter in the form of an integrated circuit mounted on and electrically connected to each of the resistive shunts and temperature compensation means, including a temperature sensor provided on or within a corresponding one of said resistive shunts or in said integrated circuit, for facilitating compensation for fluctuations in shunt resistance with variations in temperature.

2. A device as claimed in claim 1, in which the converter comprises an analog to digital converter for the corresponding one of said resistive shunts and the detector means includes a processor for receiving digital signals from the converter for each of said resistive shunts and determining whether a current imbalance exists.

3. A device as claimed in claim 2, in which the analog to digital converter for each of said resistive shunts includes a delta-sigma modulator which produces a high frequency single bit digital stream which is converted by decimation filtering into a multi-bit digital data stream at a lower frequency.

4. A residual current detection device according to claim 2, said processor is adapted to provide at least one selected from the group consisting of: power metering, circuit breaking and arc fault protection.

5. A device as claimed in claim 1, in which each of said resistive shunts takes the form of a composite strip having conductive portions at its ends and a resist portion interconnecting the conductive portions.

6. A device as claimed in claim 1, in which the corresponding one of said resistive shunts includes two copper end portions and said integrated circuit has analog input terminals connected by lead wires to the two copper end portions of the corresponding one of the resistive shunts.

7. A device as claimed in claim 6, in which the integrated circuit also has a terminal connected to a voltage reference source and includes a second converter for providing a digital stream dependent on the voltage on one of the copper end portions of the corresponding one of the resistive shunts.

8. A device as claimed in claim 1, wherein the temperature compensation means comprises said temperature sensor in said integrated circuit.

9. A residual current detection device according to claim 8, wherein the temperature sensor is an electronic semiconductor temperature sensor mounted directly onto said intermediate portion with a thermally suitable conducting glue.

10. A device as claimed in claim 1, in which the converter comprises an analog to digital converter for each of the resistive shunts.

11. A current sensor comprising a rigid metallic link member having two end portions of conductive material and an intermediate portion interconnecting the end portions, said intermediate portion being formed of a resistive material, and an integrated circuit analog to digital converter mounted on said intermediate portion, said converter having analog input terminals electrically connected to respective ones of said two end portions and digital output terminals for connection to a processing apparatus, wherein a temperature sensor is provided on or within said intermediate portion or in the integrated circuit analog to digital converter mounted onto said intermediate portion.

12. A current sensor as claimed in claim 11 in which the converter is attached to the intermediate portion by means of a layer of electrically insulating adhesive.

13. A current sensor as claimed in claim 12 in which the analog input terminals of the converter are connected to the end portions by means of wire bonds.

14. A current sensor as claimed in claim 11, in which the converter has a voltage reference terminal for connection to a reference voltage source and said converter operates to provide digital output signals representing the current through said intermediate portion and digital output signals representing the voltage on one of the end portions.

15. A current sensor as claimed in claim 11, in which said converter includes a delta-sigma modulator which provides a high frequency one-bit digital data steam.

16. A current sensor as claimed in claim 15 in which the converter also includes at least one decimation filter stage.

17. A current sensor according to claim 11, wherein the temperature sensor is an electronic semiconductor temperature sensor mounted directly onto said intermediate portion with a thermally suitable conducting glue.

18. A current sensor according to claim 11, wherein the temperature sensor is integrated into the integrated circuit analog to digital converter.

19. A current measurement apparatus comprising:
at least one current sensor comprising:
a rigid metallic link member having two end portions of conductive material and an intermediate portion interconnecting the end portions, said intermediate portion being formed of a resistive material, and
an integrated circuit analog to digital converter mounted on said intermediate portion, said converter having analog input terminals electrically connected to respective ones of said two end portions and digital output terminals, wherein a temperature sensor is provided in the integrated circuit analog to digital converter mounted onto said intermediate portion; and
a processor circuit connected to the digital output terminals of each of said at least one current sensor to receive and process digital signals received from said at least one current sensor, in order to determine whether a current imbalance exists.

20. A current measurement apparatus as claimed in claim 19 in which the processor circuit is configured to carry out one or more decimation filtering operations on the received digital signals.

21. A current measurement apparatus according to claim 19, said processor circuit is adapted to provide at least one selected from the group consisting of: power metering, circuit breaking and arc fault protection.

* * * * *

UNITED STATES PATENT AND TRADEMARK OFFICE
CERTIFICATE OF CORRECTION

PATENT NO. : 6,791,315 B2
DATED : September 14, 2004
INVENTOR(S) : Robert Charles Skerritt et al.

It is certified that error appears in the above-identified patent and that said Letters Patent is hereby corrected as shown below:

Column 2,
Line 32, "tothe" should read -- to the --.

Column 3,
Line 58, "Deg C.." should read -- Deg C. --.
Line 59, "(T-20)" should read -- $(T-20)^2$ --.
Line 60, remove superscripted "2".
Line 60, insert "." after -- $^3$] --.
Line 64, "ppm/DegC.." should read -- ppm/DegC. --.

Column 4,
Line 27, "Is" should read -- It is --.

Signed and Sealed this

First Day of February, 2005

JON W. DUDAS
*Director of the United States Patent and Trademark Office*